(12) United States Patent
Huerta et al.

(10) Patent No.: US 6,336,828 B1
(45) Date of Patent: Jan. 8, 2002

(54) POWER BUS BAR DOCKING MECHANISM

(75) Inventors: Jose Luis Huerta, Austin, TX (US); Nathan Daniel Gruber, Rochester, MN (US); Bruce Edwin Baker, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/640,820

(22) Filed: Aug. 17, 2000

(51) Int. Cl.[7] .............................................. H01R 24/00
(52) U.S. Cl. ........................ 439/629; 439/297; 361/727
(58) Field of Search ................................. 439/297, 374, 439/927, 61, 844, 845, 629, 79, 80; 361/724, 727, 796, 797, 605, 608, 611

(56) References Cited

U.S. PATENT DOCUMENTS 4,174,143 A * 11/1979 Hicks, Jr. et al. ........... 439/213
5,757,998 A * 5/1998 Thatcher et al. .............. 385/75
6,025,989 A * 2/2000 Ayd et al. .................... 361/695
6,074,228 A * 6/2000 Berg et al. ................... 439/180

* cited by examiner

Primary Examiner—Tulsidas Patel
(74) Attorney, Agent, or Firm—Duke W. Yee; Mark E. McBurney; Christopher P. O'Hagan

(57) ABSTRACT

An automatic power docking mechanism for establishing a power connection between a computer electronic subsystem and a power distribution board within a computer chassis is provided. In one embodiment, the power docking mechanism includes power pads electrically coupled to a power distribution board and a housing with slotted openings secured over the power pads. The housing's slotted openings are configured to receive power bus bars from a computer subsystem and hold the bus bars in contact with the power pads.

12 Claims, 4 Drawing Sheets

POWER BUS BAR DOCKING MECHANISM

BACKGROUND OF THE INVENTION

1. Technical Field

The present invention relates to providing an electrical power connection to electronic computer subsystems. More specifically, the invention establishes a power connection automatically when a subsystem is inserted into a computer main chassis.

2. Description of Related Art

In order to provide power to electronic subsystems installed in a computer chassis an electrical connection must be established between the computer's power distribution board and the subsystem. Until now, this connection has been provided by power docking connectors that interface between the power pads of the distribution board and bus bars attached to the subsystem. Other designers have solved the power connection problem by designing their power distribution boards and bus bars around commercially available docking connectors. These conventional connectors usually require the bus bars to be oriented and inserted perpendicular to the power distribution board.

The conventional commercially available connecting system is generally composed of a molded plastic housing, that contains louver contacts and a metal plate. When the bus bars are connected, the electrical resistance points are: bus bars-to-louvers-to-metal plate-to-power pads.

There are two main disadvantages to this conventional approach: 1) The bus bars and the power distribution board are constrained to be in a defined orientation with respect to each other, and 2) there are multiple electrical interfaces (contact resistance points) between the bus bars, docking connectors, and power distribution board.

Therefore, a power bus bar connection that establishes an automatic power connection when the subsystem is inserted into the computer chassis and that will operate given the orientation of the bus bar/power distribution board would be desirable. Furthermore, a power bus bar connection that provides less contact resistance than currently available designs would also be desirable.

SUMMARY OF THE INVENTION

The present invention provides an automatic power docking mechanism for establishing a power connection between a computer electronic subsystem and a power distribution board within a computer chassis. In one embodiment, the power docking mechanism includes power pads electrically coupled to a power distribution board and a housing with slotted openings secured over the power pads. The housing's slotted openings are configured to receive power bus bars from a computer subsystem and hold the bus bars in contact with the power pads.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
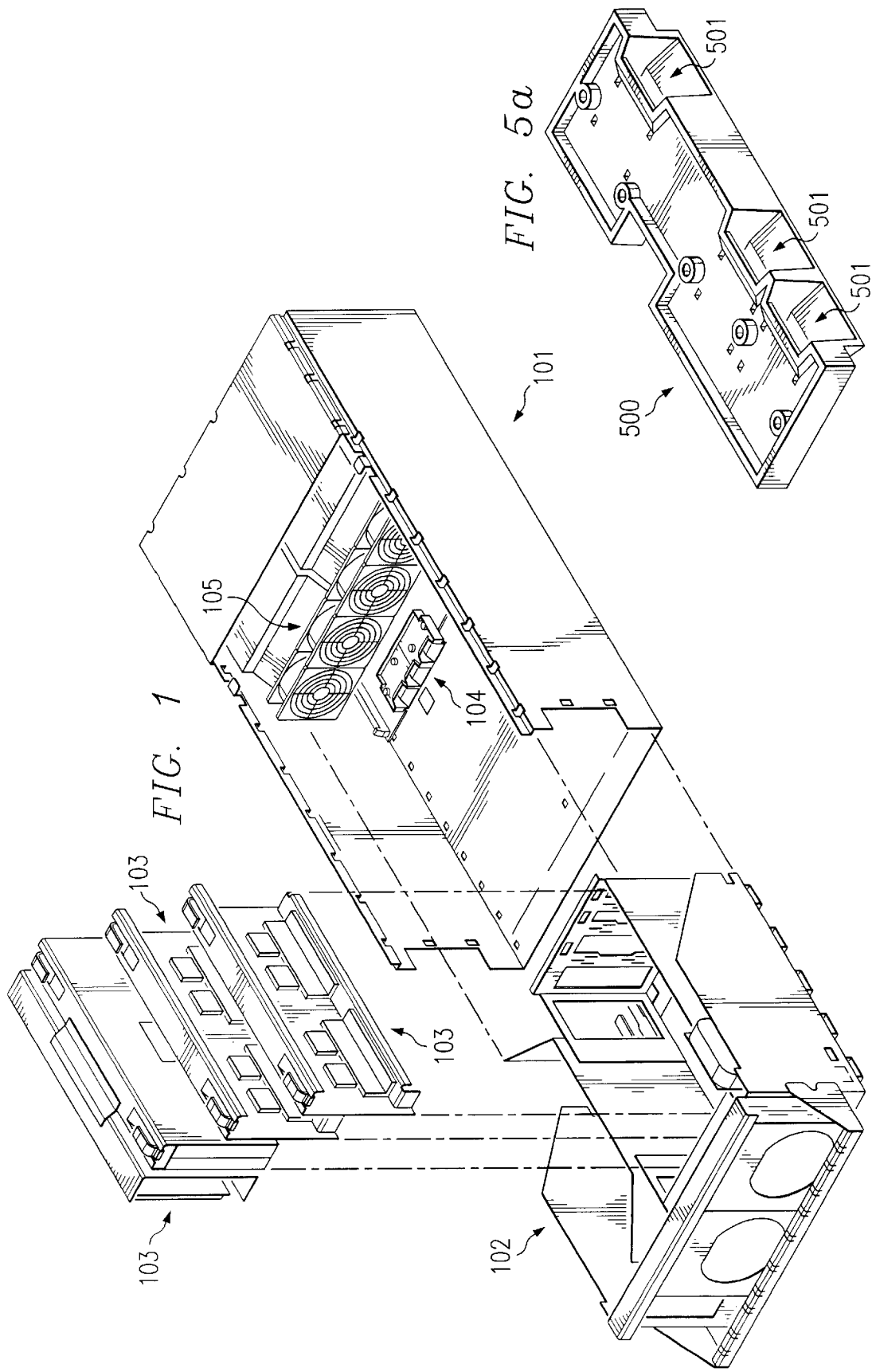
FIG. 1 illustrates the relation between the computer main chassis, the computer subsystem, and the subsystem's internal components.

With reference now to the figures, in particular FIG. 1, an exploded perspective view pictorial diagram illustrating the relation between a computer main chassis, the computer subsystem, and the internal components of the subsystem is depicted in accordance with the present invention. The computer chassis 101 is housed in the main box of the computer. The chassis 101 contains a power distribution board 104 and cooling fans 105. The computer subsystem 102 slides into the chassis 101 as indicated by the arrows and connects to the power distribution board 104. The internal components 103 of the subsystem 102, such as a processor or memory cards for example, fit into the housing of the subsystem 102 as indicated. Of course, the depicted example is not meant to imply architectural limitations with respect to the present invention.

Figure 2:
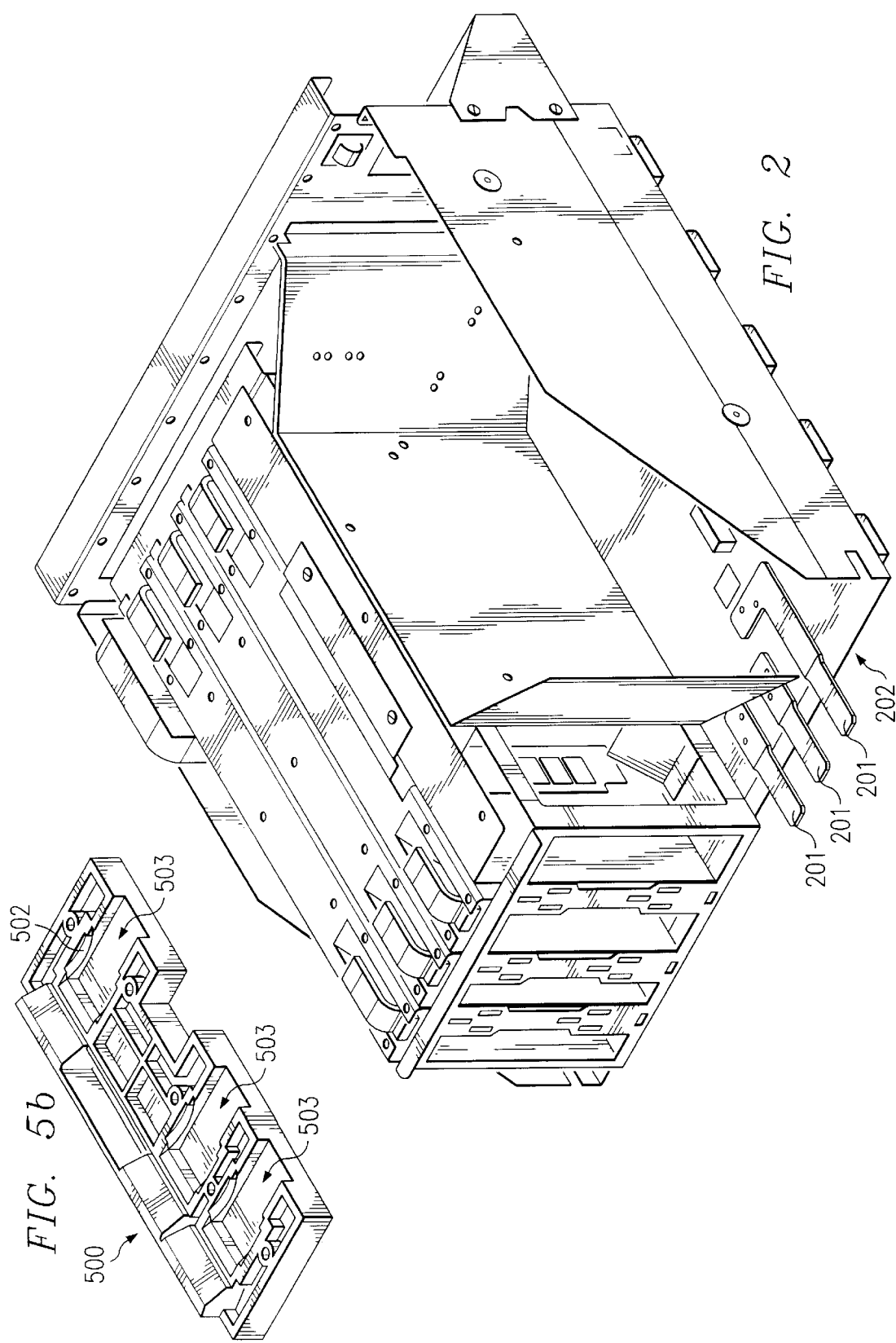
FIG. 2 shows another view of the subsystem, with a clear view of the attached power bus bars.

With reference to FIG. 2, a pictorial diagram showing more details of the computer subsystem 102 from FIG. 1 is depicted in accordance with the present invention. Here there is a clear view of the protruding power bus bars 201, which are attached to the subsystem's circuit board back plane 202. The power bus bars 201 are configured to slide into receptacles on power distribution board 104 such that power may be supplied to the various internal components 103 of the computer subsystem 102.

Figure 3:
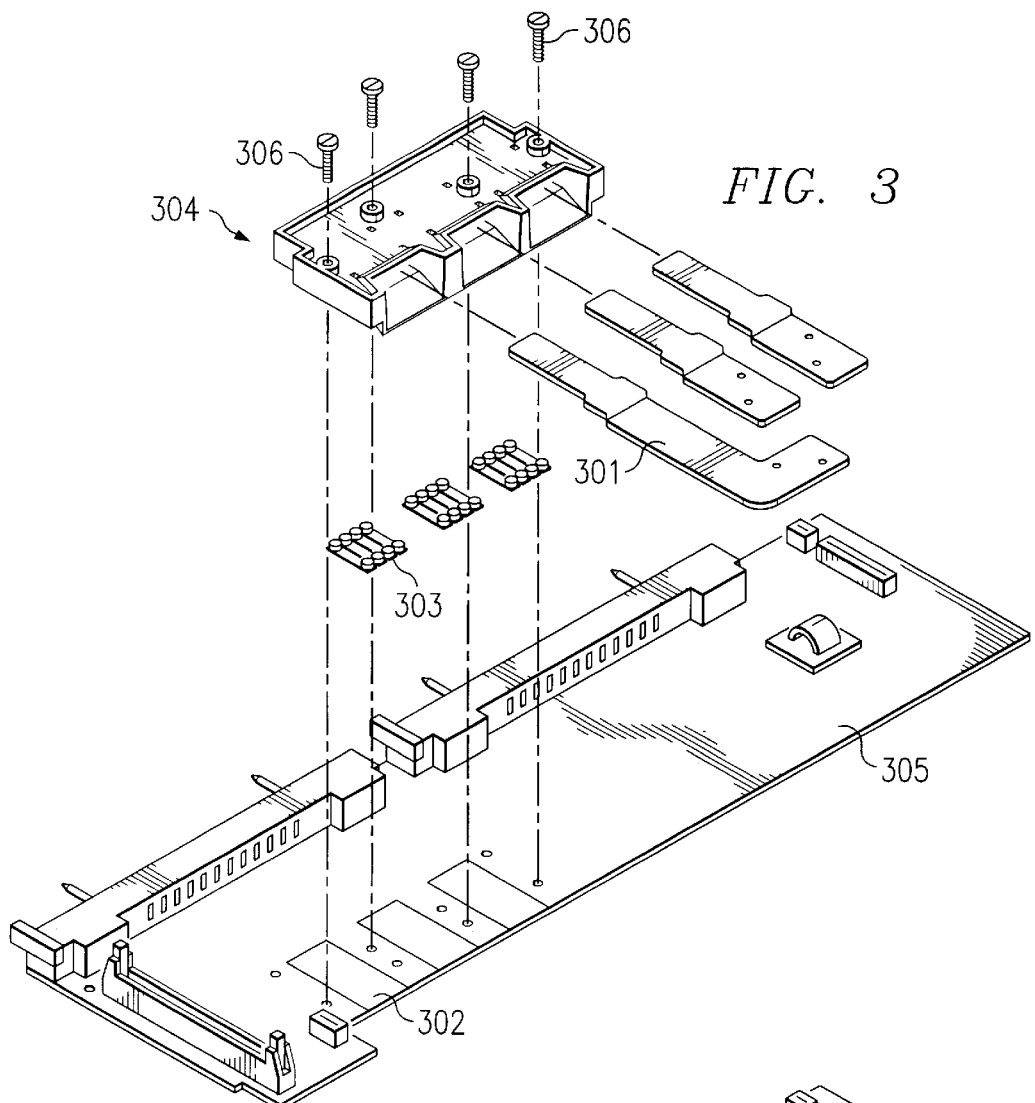
FIG. 3 illustrates the components of the power docking mechanism and their relation to the power distribution board and power bus bars.

FIG. 3 illustrates the components of the power docking mechanism and their relation to the power distribution board and power bus bars. The power bus bars 301 of a computer subsystem, such as subsystem 102 from FIG. 1, are oriented parallel to the power distribution board 305 and its power pads 302. Positioned just above each power pad 302 are commercially available louver contacts 303.

The louver contacts 303 are used to provide sufficient area contact between the power pads 302 and bus bars 301, so that a low resistance path sufficient to handle the required current between the power pads 302 and the bus bars 301 is created. The louver contacts 303 are advantageous because, typically, neither the bus bar blades 301 nor the power pads 302 are sufficiently smooth or flat for a good electrical contact. Without the louver contacts 303, the bus bar blades 301 would have to be clamped down tightly to the power pads 302. Though the louver contact 303 is a resistance contact between the bus bar 301 and the power pad 302, that resistance is much lower than it would be if the bus bar 301 and the power pad 302 were in direct contact.

A molded plastic housing 304 fits over the power pads 302 and louver contacts 303 and is held in place by threaded screws 306. The plastic housing 304 is designed to capture the contact louvers 303 in a position that allows them to directly contact the power pads 302. This design feature effectively makes the power pads 302 part of the connector system and eliminates the metal plate (contact resistance)

between the louvers and power pads, which is found in conventional connectors. It should be pointed out that the housing 304, may also be made out of any non-conducting material.

Figure 4:
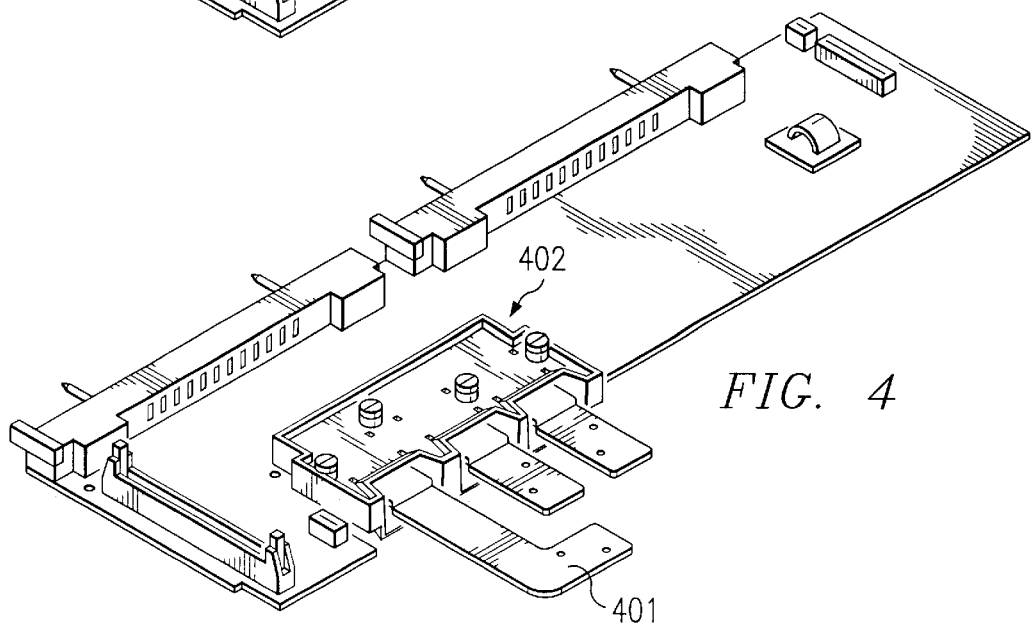
FIG. 4 illustrates the power bus bars inserted into the assembled power docking mechanism.

With reference to FIG. 4, a pictorial diagram showing the docking mechanism fully assembled is depicted in accordance with the present invention. The plastic housing 304 is in place. As the subsystem slides into the main computer chassis, the protruding bus bars 301 automatically insert into the openings in the housing 304. The openings in the housing 304 are designed to accommodate the spacing and thickness of the bus bars 301, and to provide adequate contact between the bus bars 301 and the louver contacts (not pictured).

Figure 5C:
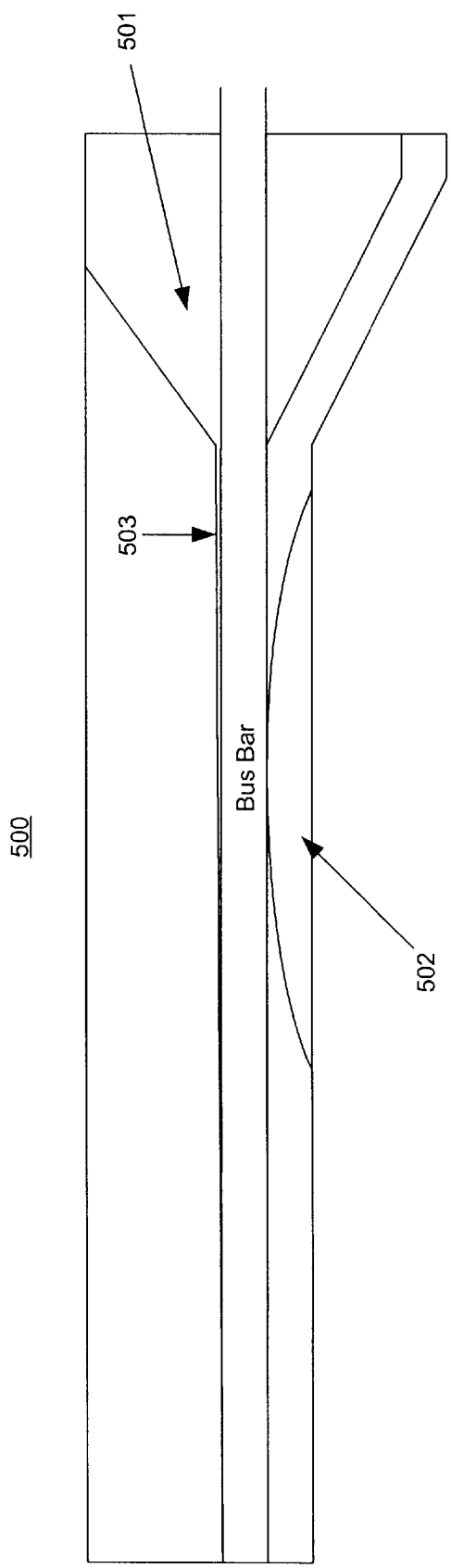
FIG. 5c illustrates the side, cross-section view of the molded plastic housing.
Figure 5A:
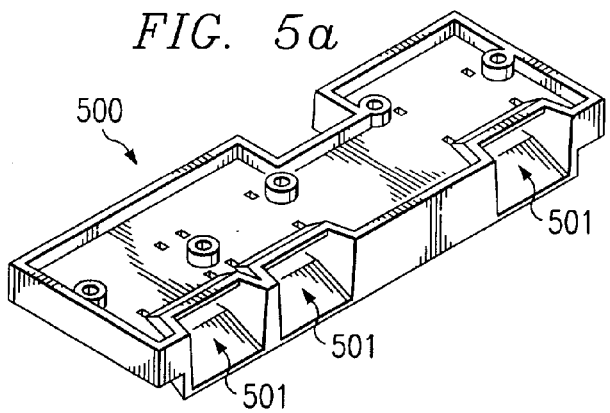
FIG. 5a illustrates the top view of the molded plastic housing.
Figure 5B:
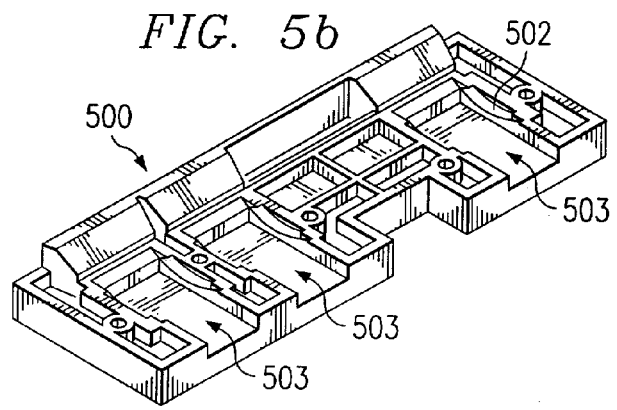
FIG. 5b illustrates the bottom view of the molded plastic housing.
Figure 5C:
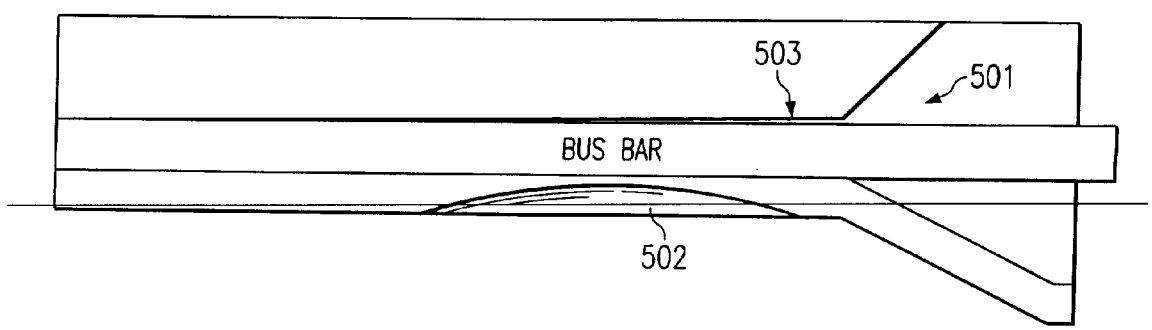

With reference to FIGS. 5a, 5b, and 5c pictorial diagrams illustrating the top and bottom views of the plastic housing unit are depicted in accordance with the present invention. In this embodiment of the housing 500, the spacing between the openings 501 for the bus bars is different than that shown in FIGS. 3 and 4. In one embodiment of the present invention, the relative spacing between bus bars as well as the openings 501 is controlled within a tolerance of approximately +/−0.2 mm. The plastic housing 500 is configured to receive and mechanically secure power bus bars and has molded-in, rectangular ramps/lead-in features 503, which guide each bus bar into contact with the louver contacts and mechanically secure the power bus bars such that an electrical contact is provided between the bus bars and the power pads. Along the sides of each rectangular slot 503 are other molded-in grooves 502, which hold the louver contacts firmly in place over the power pads.

One advantage of this arrangement is that a high current connection is automatically established as the computer electronic subsystem is inserted into the computer system chassis. Furthermore, there are less electrical interfaces between the power bus bars and the power pads than with conventional connectors, thus providing a lower resistance path for current to flow into the computer subsystem from the power supply in the chassis. Auto power docking also eliminates the need to make a separate mechanical power connection as well as having to provide access to make that connection. This translates into much easier assembly at the factory and easier field servicing.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

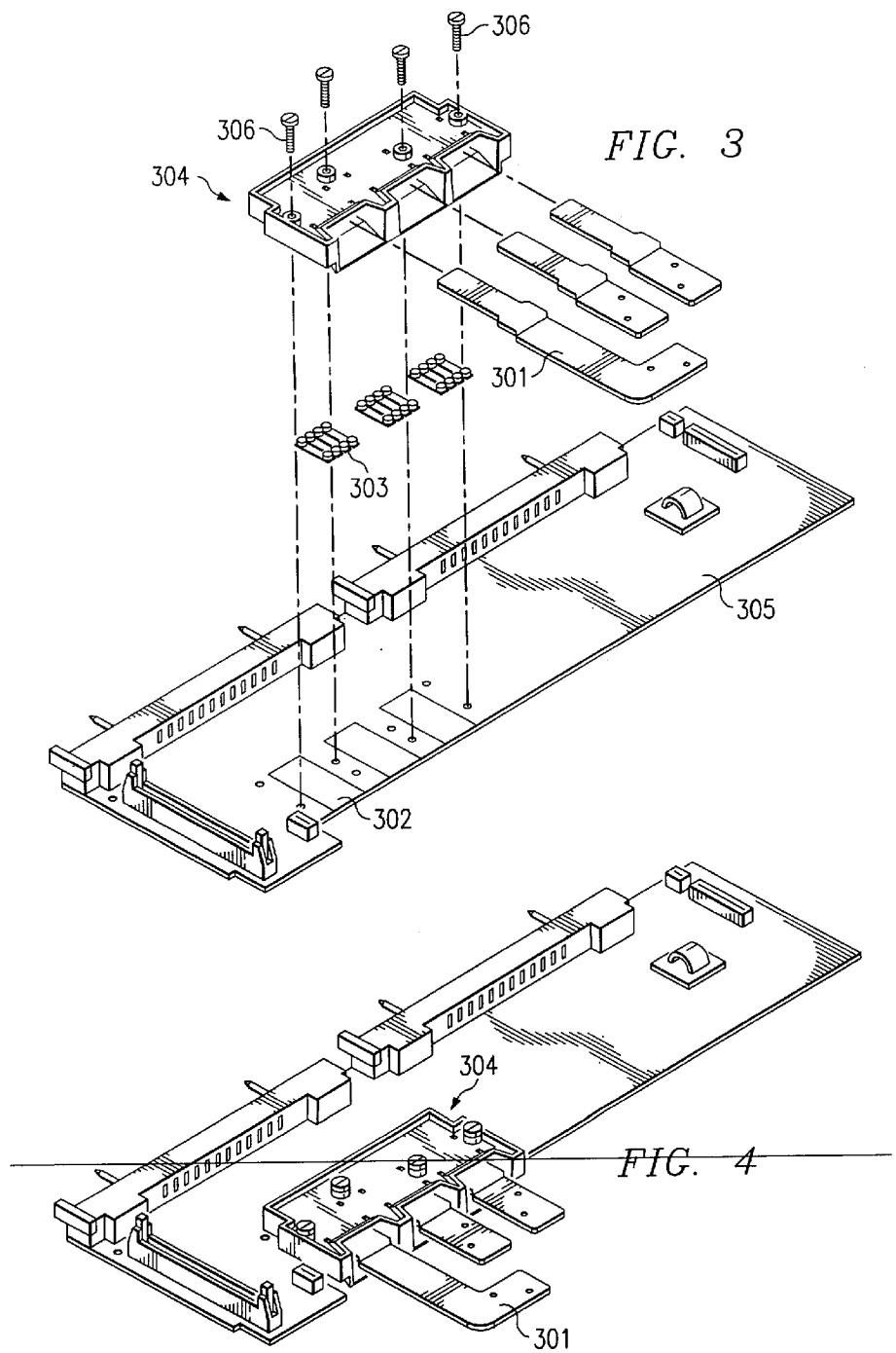

What is claimed is:

1. A power docking apparatus, comprising:
power pads electrically coupled to a power supply in a computer chassis; and
a slotted housing, enclosing at least a portion of said power pads;
wherein the slotted housing is configured to receive and mechanically secure power bus bars from a computer subsystem such that an electrical contact is provided between the power pads and the power bus bars upon insertion of the subsystem into the computer chassis.

2. The apparatus in claim 1, further comprising:
louver contacts in mechanical contact with the power pads; and
a means to mechanically secure the power bus bars to the louver contacts while the power bus bars are within the slotted housing.

3. The apparatus in claim 1, further comprising molded-in ramps behind the slotted openings of the housing to guide the power bus bars into contact with the power pads.

4. The apparatus in claim 2, further comprising molded-in grooves in the housing to secure the louver contacts in place over the power pads.

5. The apparatus in claim 1, wherein the housing is constructed from plastic.

6. The apparatus in claim 1, wherein the housing is constructed from a nonconductive material.

7. A method for power docking, comprising:
electrically coupling power pads to a power supply in a computer chassis; and
enclosing at least a portion of said power pads with a slotted housing;
wherein the slotted housing is configured to receive and mechanically secure power bus bars from a computer subsystem such that an electrical contact is provided between the power pads and the power bus bars upon insertion of the subsystem into the computer chassis.

8. The method according to claim 7, further comprising:
placing louver contacts in mechanical contact with the power pads; and
mechanically securing the power bus bars to the louver contacts while the power bus bars are within the slotted housing.

9. The method according to claim 7, further comprising molded-in ramps behind the slotted openings of the housing to guide the power bus bars into contact with the power pads.

10. The method according to claim 7, further comprising molded-in grooves in the housing to secure the louver contacts in place over the power pads.

11. The method according to claim 7, wherein the housing is constructed from plastic.

12. The method according to claim 7, wherein the housing is constructed from a nonconductive material.

* * * * *

UNITED STATES PATENT AND TRADEMARK OFFICE
CERTIFICATE OF CORRECTION

PATENT NO. : 6,336,828 B1
DATED : January 8, 2002
INVENTOR(S) : Huerta et al.

It is certified that error appears in the above-identified patent and that said Letters Patent is hereby corrected as shown below:

Drawings,
Delete drawing sheets 3, and substitute therefor the drawing sheet consisting of Figs. 3 & 4, as shown on the attached page.
Delete drawing sheet 4, and substitute therefor the drawing sheet consisting of Figs. 5a, 5b and add Figure 5c, as shown on the attached page.

Column 2,
Line 7, after "housing", please delete "and".

Column 3,
Line 29, after "503", please delete "arc" and insert -- are --.

Signed and Sealed this

Twenty-third Day of July, 2002

Attest:

JAMES E. ROGAN
Attesting Officer
Director of the United States Patent and Trademark Office